United States Patent
Halageri et al.

(10) Patent No.: US 12,386,757 B2
(45) Date of Patent: Aug. 12, 2025

(54) SYSTEM AND METHODS FOR AUTO-BAUD DETECTION

(71) Applicant: Microchip Technology Incorporated, Chandler, AZ (US)

(72) Inventors: Avinash Halageri, Karnataka (IN); Preetham Rajashekaraiah Premaleela, Karnataka (IN); Swathi G. Bhat, Karnataka (IN)

(73) Assignee: Microchip Technology Incorporated, Chandler, AZ (US)

( * ) Notice: Subject to any disclaimer, the term of this patent is extended or adjusted under 35 U.S.C. 154(b) by 7 days.

(21) Appl. No.: 18/625,332

(22) Filed: Apr. 3, 2024

(65) Prior Publication Data
US 2025/0028654 A1    Jan. 23, 2025

(30) Foreign Application Priority Data
Jul. 20, 2023   (IN) .............................. 202311049011

(51) Int. Cl.
*G06F 13/10* (2006.01)
*H03K 17/687* (2006.01)

(52) U.S. Cl.
CPC ........... *G06F 13/10* (2013.01); *H03K 17/687* (2013.01); *G06F 2213/40* (2013.01)

(58) Field of Classification Search
CPC .... G06F 13/10; G06F 2213/40; H03K 17/687
See application file for complete search history.

(56) References Cited

U.S. PATENT DOCUMENTS

| | | | |
|---|---|---|---|
| 5,982,837 A | 11/1999 | Earnest | 375/377 |
| 6,798,869 B1 | 9/2004 | Sidhu et al. | 379/93.33 |
| 7,116,739 B1 * | 10/2006 | Yearsley | H04L 7/0331 375/370 |
| 9,184,834 B1 * | 11/2015 | Zhang | H04B 10/50577 |
| 11,038,508 B2 * | 6/2021 | de Haas | H03F 3/26 |
| 2003/0194017 A1 * | 10/2003 | Woodworth | H04L 27/24 375/286 |
| 2022/0061008 A1 | 2/2022 | Bradley | |

OTHER PUBLICATIONS

International Search Report and Written Opinion, Application No. PCT/US2024/038552, 11 pages, Oct. 21, 2024.

* cited by examiner

*Primary Examiner* — Zachary K Huson
(74) *Attorney, Agent, or Firm* — SLAYDEN GRUBERT BEARD PLLC

(57) ABSTRACT

A circuit may enable communication between a primary device and one or more secondary devices. The communication may utilize a Universal Asynchronous Receiver Transmitter (UART) protocol. In operation, the primary device may require information on the baud rate of the secondary device. The UART may operate in an inverted polarity mode, and this inverted polarity may be interpreted by the secondary device as a request to enter an auto-baud detection mode. Using the inverted polarity mode to enter the auto-baud detection mode may prevent excessive delays in the UART communication and may prevent the need for additional pins to implement the auto-baud detection mode.

14 Claims, 3 Drawing Sheets

SYSTEM AND METHODS FOR AUTO-BAUD DETECTION

PRIORITY

This application claims priority to commonly owned Indian Provisional Patent Application 20/231,1049011 filed Jul. 20, 2023, the entire contents of which are hereby incorporated by reference for all purposes.

FIELD OF THE INVENTION

The present disclosure relates to systems and methods for communication between a primary device and a secondary device, specifically to systems and methods for auto-baud detection between a primary device and a secondary device.

BACKGROUND

A primary device may communicate with a secondary device over a serial communication protocol. The serial communication protocol may be implemented by a universal asynchronous receiver-transmitter (UART) circuit or by another type of communication circuit.

A primary device may include a communication circuit with a respective transmitter circuit and a receiver circuit, and a secondary device may include a communication circuit with a respective transmitter circuit and a receiver circuit. In operation, the transmitter circuit in the primary device may communicate with the receiver circuit in the secondary device, and the transmitter circuit in the secondary device may communicate with the receiver circuit in the primary device. In one of various examples, a primary device may comprise a microcontroller. Microcontrollers are systems on a chip that generally comprise a processor, a memory, a plurality of input/output ports, and a variety of peripheral devices. In particular, a variety of peripheral devices can be provided such as configurable logic cells, complementary waveform/output generators, dedicated arithmetic units, numerical controlled oscillators and programmable switch mode controllers. Microcontrollers may include host controllers to communicate with peripheral devices over a communication protocol, the communication protocol including but not limited to a UART protocol. The primary device may comprise a digital processor with memory and a plurality of programmable input and output ports.

The secondary device may comprise a peripheral device as described previously, including but not limited to a sensor, amplifier, oscillator, battery gauge, data converter and a logic device. The secondary device may communicate with a primary device using a communication protocol, the communication protocol including but not limited to a UART protocol.

The secondary device may comprise a MOSFET driver circuit. The primary device may communicate configuration information to the secondary device, including but not limited to the baud rate of communication between the primary device and the secondary device.

The secondary device may be sensitive to temperature and may operate at a different baud rate than the rate configured by the primary device. Various methods may be used to adjust the baud rate to compensate for variations in baud rate, these methods also called auto-baud detection. In one of various examples of auto-baud detection, a pin generally designated for use by the UART may be reconfigured as an input/output (I/O) pin and used as a communication channel during auto-baud detection, but this auto-baud detection method may not be used in cases with a dedicated UART pin which may not be reconfigured as an I/O pin. The term pin, as used herein, is not meant to be limited to any particular type of physical structure, and may include, without limitation, gull-wing or J-lead terminals, solder balls or lands. In another example of auto-baud detection, the baud rate of communication between the UART circuits may be slowed to accommodate the required delays in the auto-baud protocol. In addition, a byte of data may be transmitted to enable the auto-baud detection. The change in baud rate and the transmission of a byte of data all slow down the auto-baud detection and prevent other peripherals in the microcontroller from using the UART circuit.

There is a need for auto-baud detection which can be implemented by any device with a UART circuit without requiring additional pins, and which does not reduce the baud rate of communication between the UART devices during the auto-baud detection.

SUMMARY

The examples herein enable a system and method for auto-baud detection between a primary device and a secondary device.

According to one aspect, a system includes a primary device. The primary device may comprise a primary device transmitter circuit and a primary device receiver circuit. The device may include a secondary device comprising a secondary device transmitter circuit and a secondary device receiver circuit. The primary device may enable the primary device transmitter circuit and the secondary device may enable the receiver circuit in the secondary device. The transmitter circuit in the primary device may transmit a predetermined voltage for at least a predetermined time during an inverted polarity mode. The receiver circuit in the secondary device may detect the predetermined voltage for the predetermined time and may enter an auto-baud detection mode. The primary device may disable the transmitter circuit in the primary device and enable the receiver circuit in the primary device. The transmitter circuit in the secondary device may transmit a predetermined sequence and the receiver circuit in the primary device may receive the predetermined sequence and may calculate a baud rate based on the received predetermined sequence.

According to one aspect, a method includes steps of: enabling a transmitter circuit in a primary device, configuring the transmitter circuit in the primary device to an inverted polarity mode to drive a communication path to a predetermined voltage for a predetermined time, detecting, at a receiver circuit in a secondary device, the predetermined voltage for the predetermined time and entering an auto-baud detection mode, configuring, after the predetermined time, the transmitter circuit in the primary device in a non-inverted polarity mode, disabling the transmitter circuit in the primary device, enabling, responsive to entering the auto-baud detection mode, a transmitter circuit in the secondary device and transmitting a predetermined sequence on the communication path, receiving the predetermined sequence at the primary device and calculating a baud rate of the transmission of the predetermined sequence, and disabling the auto-baud detection mode in the primary device.

DETAILED DESCRIPTION

Figure 1:
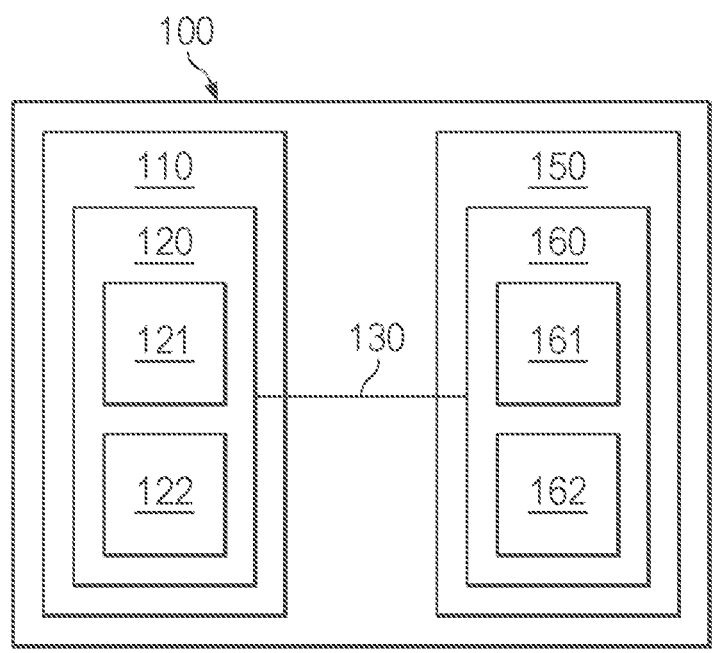
FIG. 1 illustrates one of various examples of a system for auto-baud detection between a primary device and a secondary device.

FIG. 1 illustrates one of various examples of a system 100 for auto-baud detection. System 100 may be a semiconductor system-on-a-chip (SoC), a microcontroller, or may be a combination of discrete components. System 100 may comprise a primary device 110 and a secondary device 150, which primary device 110 and secondary device 150 may be in communication by a communication path 130.

Primary device 110 may include primary device communication circuit 120. Primary device communication circuit 120 may include primary device primary device transmitter circuit 121 and primary device receiver circuit 122. Primary device 110 may include other circuits and passive components not specifically mentioned. Primary device 110 may include a clock signal for transmitting and receiving data. In some examples, primary device 110 may include a clock circuit generating the clock signal.

Secondary device 150 may include secondary device communication circuit 160.

Secondary device communication circuit 160 may include secondary device receiver circuit 161 and secondary device transmitter circuit 162. Secondary device 150 may include other circuits and passive components not specifically mentioned. Secondary device 150 may include a clock signal for transmitting and receiving data. In some examples, secondary device 150 may include a respective clock circuit generating the clock signal.

Primary device 110 may be a microcontroller. Secondary device 150 may be a peripheral device, including but not limited to a sensor, amplifier, oscillator, battery gauge, data converter, power driver, or a logic device. Secondary device 150 may be a MOSFET driver.

Communication path 130 may be a UART interface, and may comprise a transmit line and a receive line.

In operation, primary device 110 may communicate with secondary device 150. Primary device transmitter circuit 121 may transmit signals over communication path 130 and signals may be received at secondary device receiver circuit 161. Secondary device 150 may decode signals received at secondary device receiver circuit 161 and may modify operation of secondary device 150 based on the decoded signals. Secondary device 150 may communicate with primary device 110. Secondary device transmitter circuit 162 may transmit signals over communication path 130 and signals may be received at primary device receiver circuit 122. Primary device 110 may decode signals received at primary device receiver circuit 122 and may modify operation of primary device 110 based on the decoded signals.

The example illustrated in FIG. 1 is a half-duplex implementation, with primary device transmitter circuit 121 and secondary device transmitter circuit 162, respectively, and secondary device receiver circuit 161 and primary device receiver circuit 122, respectively, sharing communication path 130. Other examples may include a dedicated connection between primary device transmitter circuit 121 and secondary device receiver circuit 161, and another dedicated connection between secondary device transmitter circuit 162 and primary device receiver circuit 122. Primary device transmitter circuit 121 may be a push-pull driver or may be an open drain driver with a pull-up resistor on communication path 130. Secondary device transmitter circuit 162 may be a push-pull driver or may be an open drain driver with a pull-up resistor on communication path 130.

Primary device communication circuit 120 may be a UART circuit. Communication circuit 160 may be a UART circuit.

In one of various examples, system 100 may implement auto-baud detection. Primary device transmitter circuit 121 may operate in a non-inverted mode, wherein communication path 130 may be held at a logic high level when primary device transmitter circuit 121 is enabled and in an idle state, i.e. not transmitting data. Primary device transmitter circuit 121 may operate in an inverted mode, wherein communication path 130 may be held at a logic low level when primary device transmitter circuit 121 is enabled and in an idle state, i.e. not transmitting data. Secondary device transmitter circuit 162 may operate in a non-inverted mode, wherein communication path 130 may be held at a logic high level when secondary device transmitter circuit 162 is enabled and in an idle state, i.e. not transmitting data. Secondary device transmitter circuit 162 may operate in an inverted mode, wherein communication path 130 may be held at a logic low level when secondary device transmitter circuit 162 is enabled and in an idle state, i.e. not transmitting data. The idle state of the non-inverted polarity mode may be opposite in polarity to the idle state in the inverted polarity mode.

In operation, primary device transmitter circuit 121 may drive communication path 130 with a predetermined voltage for a predetermined time to secondary device receiver circuit 161 and may signal an auto-baud detection mode. Primary device transmitter circuit 121 may drive the predetermined voltage by using the idle state of primary device transmitter circuit 121 in the inverted polarity mode. Primary device transmitter circuit 121 may be a push-pull driver or an open drain pull-down driver. The predetermined voltage may be a ground voltage. Primary device transmitter circuit 121 may be enabled in a non-inverted polarity mode. In one of various examples, primary device transmitter circuit 121 may be enabled by a microcontroller in primary device 110 or may be enabled by communication with another controller. In the non-inverted polarity mode, primary device transmitter circuit 121 may hold communication path 130 at a logic high level when in an idle state. Primary device transmitter circuit 121 may drive the communication path 130, or communication path 130 may be pulled to a logic high level by a pull-up resistor. Primary device transmitter circuit 121 may be in an idle state when enabled but not transmitting data. Primary device transmitter circuit 121 may then operate in an inverted polarity mode. In one of various examples, primary device transmitter circuit 121 may operate in an inverted polarity mode. When inverted polarity mode is enabled, primary device transmitter circuit 121 may drive communication path 130 to a logic low level, as logic low is the idle state when the inverted polarity mode is enabled. Communication path 130 may remain at a logic low state for a predetermined time. Secondary device receiver circuit 161 may detect the low level on communication path 130 for the predetermined time, and may interpret this as a request by primary device 110 to enter auto-baud detection mode. Secondary device 150 may enter the auto-baud detection mode based on detecting the low level on communication path 130 for the predetermined time. Auto-baud detection mode may be indicated based on setting a register value. After the predetermined time, primary device transmitter circuit 121 may operate in the non-inverted polarity mode and subsequently primary device transmitter circuit 121 may be disabled. Primary device receiver circuit 122 may be enabled and secondary device transmitter circuit 162 may be enabled. Secondary device 150 may transmit a predetermined sequence over communication path 130 as specified by the auto-baud detection mode. In one of various examples, secondary device 150 may transmit a fixed binary code from secondary device transmitter circuit 162 to primary device receiver circuit 122. The fixed binary code may represent a control word transmitted from the secondary device transmitter circuit 162 to the primary device receiver circuit 122. Primary device 110 may receive the predetermined sequence at primary device receiver circuit 122 and may calculate a baud rate of the received predetermined sequence. The predetermined sequence may comprise an acknowledge word. The calculation of a baud rate may be based on a timer, a counter, a phase-locked loop, an external clock or another method. After the predetermined sequence is received, auto-baud detection mode may be disabled.

Figure 2:
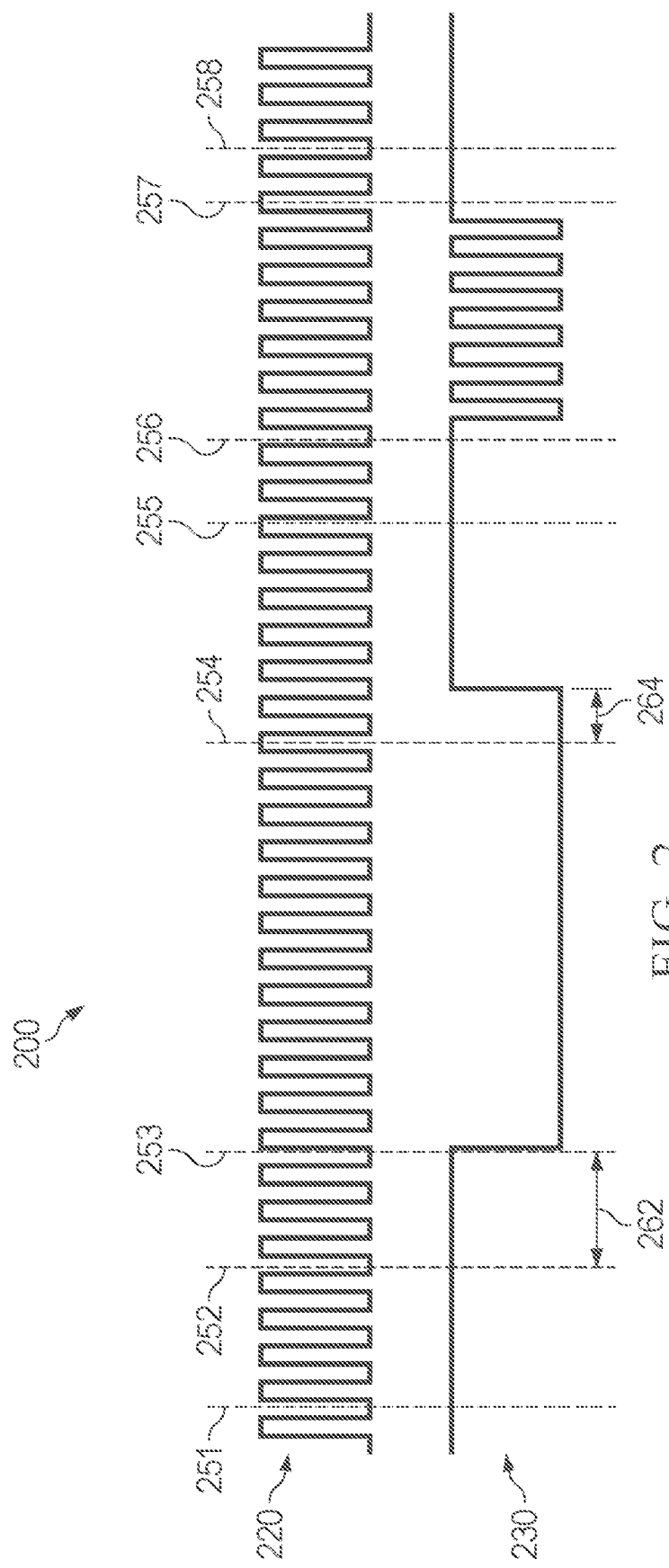
FIG. 2 illustrates a timing diagram of one of various examples of auto-baud detection.

FIG. 2 illustrates a timing diagram 200 of one of various examples of auto-baud detection. Clock signal 220 may be a clock signal used to transmit and receive data. Clock signal 220 may be a common clock signal in primary device 110 and secondary device 150 as described and illustrated in reference to FIG. 1. Bus 230 may be a data bus. Bus 230 may be one of various examples of communication path 130 as described and illustrated in reference to FIG. 1. Bus 230 may enable communication between primary device 110 and secondary device 150 in a system as described and illustrated in FIG. 1.

In operation, at time 251, transmitter circuit 121 in primary device 110 may be enabled to transmit over bus 230 in a transmit mode. Transmitter circuit 121 in the primary device 110 may operate in non-inverted polarity mode. In one of various examples, the transmitter circuit in the primary device may hold bus 230 at a logic high level awaiting the first transmission. In other examples, the transmitter circuit in the primary device may operate in an open drain mode, and a pull-up resistor on bus 230 may hold bus 230 at a logic high level awaiting the first transmission. Logic high may be the idle state of the transmitter in the non-inverted polarity mode. At time 252, the transmitter circuit may transmit in an inverted polarity mode. In the inverted polarity mode, the transmitter circuit may drive bus 230 to a logic low level, as shown at time 253. Logic low may represent the idle state of the transmitter circuit when the inverted polarity mode is enabled. By changing from the non-inverted polarity mode to the inverted polarity mode, the logic level of bus 230 may be used as a communication signal to initiate the auto-baud detection mode. Time period 262 may represent a delay between the time of configuration of transmitter circuit 121 in the inverted polarity mode at time 252 and the transmitter driving bus 230 to a logic low level.

Bus 230 may remain at a logic low state for a predetermined time. In the example illustrated in FIG. 2, bus 230 may remain low for at least 1.8 ms, but this is not intended to be limiting. Receiver 161 in the secondary device 150 may detect the logic low level on bus 230 and the secondary device 150 may enter an auto-baud detection mode at least partially in response to detection of the logic low level on bus 230 for the predetermined time. After the predetermined time has elapsed, at time 254, the transmitter circuit 121 may operate in non-inverted polarity mode, and the transmitter circuit 121 in the primary device may therefore drive bus 230 to a logic high level, which logic high may represent the idle state of bus 230 when the transmitter is in the non-inverted polarity mode. Time period 264 may represent a delay between the configuration in the non-inverted polarity mode at time 254 and the bus 230 being driven to the logic high state. At time 255, the transmitter circuit 121 in the primary device 110 may be disabled. At time 256, the primary device 110 may be in an auto-baud detection mode. The auto-baud detection mode of the primary device 110 may be indicated by a configuration register in the primary device 110 or by another method. At time 256, the secondary device 150 may transmit a predetermined sequence over bus 230 as specified by the auto-baud detection mode. In the example illustrated in FIG. 2, the secondary device may transmit a fixed binary code. In the example illustrated in FIG. 2, the fixed binary code may be 0x55h, but this is not intended to be limiting. The secondary device may transmit a different fixed binary code of any word width. The example illustrated in FIG. 2, clock signal 220 may be used to sample bus 230 on both the rising edge and the falling edge, but this is not intended to be limiting.

The predetermined sequence may terminate at time 257. Primary device 110 may receive the predetermined sequence and may calculate a baud rate of the received predetermined sequence. The calculation of the baud rate of the predetermined sequence may be based on a timer, a counter, a phase-locked loop or another method. After the predetermined sequence is received, primary device 110 may disable the auto-baud detection mode at time 258 and auto-baud detection mode may be disabled in secondary device 150.

The example of FIG. 2 illustrates one of various examples of communication between a primary device and a secondary device. The secondary device may be a MOSFET driver circuit, but this is not intended to be limiting. In other examples, a primary device may communicate with another peripheral device.

Figure 3:
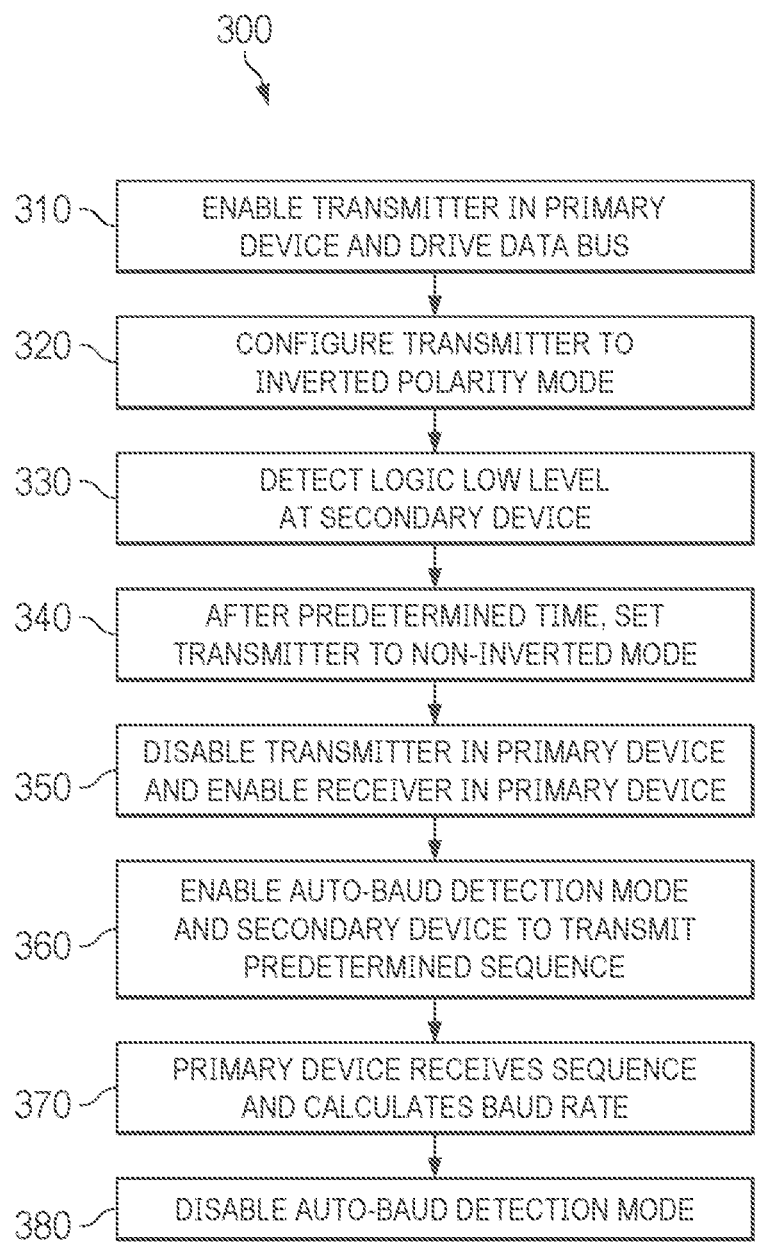
FIG. 3 illustrates a method of auto-baud detection.

FIG. 3 illustrates a method 300 of auto-baud detection.

At operation 310, a transmitter circuit in a primary device may be enabled in a non-inverted polarity mode and may drive a data bus to a logic high level during an idle state. Additionally, a transmitter circuit may be enabled. At operation 320, the polarity of the transmitter may be configured to an inverted mode and the data bus may transition to a predetermined voltage. In one of various examples, the data bus may transition to a logic low level for at least a predetermined time. The predetermined voltage may be a ground voltage. At operation 330, a receiver circuit in a secondary device may detect the logic low level on the data bus for the predetermined time. At operation 340, after the predetermined time, the polarity of the transmitter may be configured to a non-inverted polarity mode and the data bus may transition to a logic high level. The data bus may be driven by a push-pull driver in the transmitter in the primary device or may be pulled to a logic high level by a pullup resistor. At operation 350, the transmitter in the primary device may be disabled and the receiver in the primary device may be enabled transmitter in the secondary device may be enabled. At operation 360, an auto-baud detection mode may be enabled in the primary device and the transmitter in the secondary device may transmit a predetermined sequence over the data bus. In one of various examples, the predetermined sequence may comprise an acknowledge word. At operation 370, a receiver circuit in the primary device may receive the predetermined sequence and may calculate a baud rate of the predetermined sequence. At operation 380, the auto-baud detection mode may be disabled in the primary device and in the secondary device.

The invention claimed is:

1. A system comprising:
a primary device comprising a primary device transmitter circuit and a primary device receiver circuit;
a secondary device comprising a secondary device transmitter circuit and a secondary device receiver circuit;
wherein:
the primary device enables the primary device transmitter circuit and the secondary device enables the receiver circuit in the secondary device;
the transmitter circuit in the primary device to transmit a predetermined voltage for at least a predetermined time during an inverted polarity mode;
the receiver circuit in the secondary device to detect the predetermined voltage for the predetermined time and to enter an auto-baud detection mode;
the primary device to disable the transmitter circuit in the primary device and enable the receiver circuit in the primary device;
the transmitter circuit in the secondary device to transmit a predetermined sequence; and
the receiver circuit in the primary device to receive the predetermined sequence and to calculate a baud rate based on the received predetermined sequence.

2. The system as claimed in claim 1, the secondary device comprising a MOSFET driver.

3. The system as claimed in claim 1, the primary device is a microcontroller.

4. The system as claimed in claim 1, the transmitter circuit in the primary device to transmit a predetermined voltage during an idle state in an inverted polarity mode.

5. The system as claimed in claim 1, the predetermined voltage for the predetermined time comprising a ground voltage for a duration of between about 1.29 msec and about 2 msec.

6. The system as claimed in claim 1, the predetermined voltage transmitted during the inverted polarity mode to be opposite in polarity from a voltage transmitted during a non-inverted mode.

7. The system as claimed in claim 1, the predetermined sequence comprising an acknowledge word transmitted from the secondary device to the primary device.

8. A method comprising:
enabling a transmitter circuit in a primary device;
configuring the transmitter circuit in the primary device to an inverted polarity mode to drive a communication path to a predetermined voltage for a predetermined time;
detecting, at a receiver circuit in a secondary device, the predetermined voltage for the predetermined time and entering an auto-baud detection mode;
configuring, after the predetermined time, the transmitter circuit in the primary device in a non-inverted polarity mode;
disabling the transmitter circuit in the primary device;
enabling, responsive to entering the auto-baud detection mode, a transmitter circuit in the secondary device and transmitting a predetermined sequence on the communication path;
receiving the predetermined sequence at the primary device and calculating a baud rate of the transmission of the predetermined sequence; and
disabling the auto-baud detection mode in the primary device.

9. The method as claimed in claim 8, the secondary device comprising a MOSFET driver.

10. The method as claimed in claim 8, the primary device comprising a microcontroller.

11. The method as claimed in claim 8, the predetermined voltage for the predetermined time comprising a ground voltage for a duration of between about 1.29 msec and about 2 msec).

12. The method as claimed in claim 8, the configuring the transmitter circuit in the primary device comprising writing one or more control words to the transmitter circuit in the primary device.

13. The method as claimed in claim 8, the predetermined voltage transmitted during the inverted polarity mode to be opposite in polarity from a voltage transmitted during a non-inverted polarity mode.

14. The method as claimed in claim 8, the predetermined sequence comprising an acknowledge word transmitted from the secondary device to the primary device.

* * * * *